United States Patent
Sasaki et al.

(10) Patent No.: US 9,412,635 B2
(45) Date of Patent: Aug. 9, 2016

(54) ELECTROSTATIC CHUCK DEVICE

(71) Applicants: Tokyo Electron Limited, Tokyo (JP); Sumitomo Osaka Cement Co., Ltd., Tokyo (JP)

(72) Inventors: Yasuharu Sasaki, Kurokawa-Gun (JP); Kaoru Oohashi, Kurokawa-gun (JP); Tomoyuki Takahashi, Kurokawa-gun (JP); Tadashi Aoto, Kurokawa-gun (JP); Mamoru Kosakai, Tokyo (JP); Shinichi Maeta, Tokyo (JP); Yukio Miura, Tokyo (JP); Takashi Sato, Tokyo (JP); Kei Furuuchi, Tokyo (JP)

(73) Assignees: Tokyo Electron Limited, Tokyo (JP); Sumitomo Osaka Cement Co., Ltd., Tokyo (JP)

( * ) Notice: Subject to any disclaimer, the term of this patent is extended or adjusted under 35 U.S.C. 154(b) by 84 days.

(21) Appl. No.: 14/374,536

(22) PCT Filed: Feb. 6, 2013

(86) PCT No.: PCT/JP2013/052759
§ 371 (c)(1),
(2) Date: Jul. 25, 20_14

(87) PCT Pub. No.: WO2013/118781
PCT Pub. Date: Aug. 15, 2013

(65) Prior Publication Data
US 2014/0376148 A1 Dec. 25, 2014

(30) Foreign Application Priority Data
Feb. 8, 2012 (JP) ................................. 2012-025032

(51) Int. Cl.
*H01T 23/00* (2006.01)
*H01L 21/683* (2006.01)
*B23Q 3/15* (2006.01)
*H01L 21/67* (2006.01)

(52) U.S. Cl.
CPC ............. *H01L 21/6833* (2013.01); *B23Q 3/15* (2013.01); *H01L 21/67109* (2013.01); *H01L 21/6831* (2013.01)

(58) Field of Classification Search
CPC .................................................. H01L 21/6833
USPC ......................................................... 361/234
See application file for complete search history.

(56) References Cited

U.S. PATENT DOCUMENTS

| | | | | |
|---|---|---|---|---|
| 5,946,184 A * | 8/1999 | Kanno | ............... | H01L 21/6833 279/128 |
| 6,373,681 B2 * | 4/2002 | Kanno | ......................... | 361/234 |
| 8,125,757 B2 * | 2/2012 | Morooka | .......... | H01L 21/67069 361/234 |

FOREIGN PATENT DOCUMENTS

| | | |
|---|---|---|
| JP | 03-217043 A | 9/1991 |
| JP | 2003194723 A | 7/2003 |
| JP | 2004031665 A | 1/2004 |
| WO | 2008018341 A1 | 2/2008 |

OTHER PUBLICATIONS

Japanese Patent Office, International Search Report issued in corresponding International Patent Application No. PCT/JP2013/052759 and English translation (May 14, 2013) (4 pages).

* cited by examiner

*Primary Examiner* — Stephen W Jackson
(74) *Attorney, Agent, or Firm* — Wood, Herron & Evans, LLP

(57) ABSTRACT

An electrostatic chuck device includes an electrostatic chuck part that has an upper surface as a placement surface for placing a plate-shaped sample and has an internal electrode for electrostatic attraction built therein; and a cooling base part that cools the electrostatic chuck part. The electrostatic chuck part and the cooling base part are integrally adhered to each other via an adhesive layer. An insulator having a double pipe structure including an insulator and an insulator provided coaxially with an outer peripheral portion of the insulator is provided in a cooling gas hole, formed in the electrostatic chuck part and the cooling base part, so as to cover an exposed surface of the adhesive layer on the cooling gas hole side.

5 Claims, 1 Drawing Sheet

ELECTROSTATIC CHUCK DEVICE

TECHNICAL FIELD

The present invention relates to an electrostatic chuck device, and more particularly, to an electrostatic chuck device that is suitably used for a high-frequency discharge type plasma treatment apparatus that applies high-frequency waves to an electrode so as to generate plasma, and performs plasma treatment, such as plasma etching, on a plate-shaped sample, such as a semiconductor wafer, with this plasma.

Priority is claimed on Japanese Patent Application No. 2012-025032, filed Feb. 8, 2012, the content of which is incorporated herein by reference.

BACKGROUND ART

In recent years, it has been required to achieve high integration and high performance of elements in the semiconductor industry supporting IT technology that progresses rapidly. Therefore, in a semiconductor manufacturing process, further improvements in micro-fabrication technology has been required. In this semiconductor manufacturing process, an etching technique is an important micro-fabrication technology. In recent years, in this etching technique, a plasma etching technique capable of efficient and large-area micro-fabrication has been a main stream.

This plasma etching technique is a kind of dry etching technique. In this technique, a mask pattern is formed on a solid material serving as a processing target with a resist, and reactive gas is introduced into a vacuum in a state in which this solid material is supported in the vacuum, and a high-frequency electrical field is applied to the reactive gas. Accordingly, accelerated electrons collide with gas molecules and are brought into a plasma state, and radicals (free radicals) and ions, which are generated from this plasma, are made to react with the solid material and are removed as a reactive product. As a result, a fine pattern is formed on the solid material.

Meanwhile, there is a plasma CVD method as one of the thin film growth techniques that combine source gas through the action of the plasma and deposit the obtained compound on a substrate. This method is a film forming method that applies a high-frequency electrical field to gas containing raw material molecules to perform plasma discharge, decomposes the raw material molecules with the electrons accelerated through this plasma discharge, and deposits the obtained compound. A reaction, which has not occurred only with thermal excitation at low temperature, is also allowed in the plasma because the gas molecules in a system collide with each other and are activated and turned into radicals in the plasma.

In semiconductor manufacturing apparatuses using plasma, such a plasma etching apparatus and a plasma CVD apparatus, an electrostatic chuck device has conventionally been used from the former as a device that simply attaches and fixes a wafer to a sample platform and maintains this wafer at a desired temperature.

As such an electrostatic chuck device, for example, the following electrostatic chuck device is proposed and is presented for practical use (PTL 1). In this electrostatic chuck device, an electrostatic chuck part where an upper surface of a ceramic substrate is used as a placement surface for placing a plate-shaped sample, such as a wafer, and which a plate-shaped electrode for electrostatic attraction is buried in, and a cooling base part in which a refrigerant flow path for circulating cooling water is formed, are integrally adhered to each other with an adhesive layer, and cooling gas holes are formed so as to pass through the electrostatic chuck part and the cooling base part.

CITATION LIST

Patent Literature

[PTL 1] Japanese Unexamined Patent Application, First Publication No. 2004-31665

SUMMARY OF INVENTION

Technical Problem

In the above-described related-art electrostatic chuck device, there is a concern that plasma or radicals (free radicals) may enter an adhesive layer, which integrally adheres the electrostatic chuck part and the cooling base part to each other, from gas flow holes, and may erode this adhesive layer.

When this adhesive layer is eroded by the plasma or radicals (free radicals), there is a problem in that the adhesive strength of the adhesive layer decreases and consequently, the electrostatic chuck part peels off from the cooling base part.

Thus, in order to prevent the adhesive layer from being eroded by the plasma or radicals (free radicals), it is conceivable that the thickness of the adhesive layer be made small. However, if the thickness of the adhesive layer is made to be small, a problem occurs in that the voltage resistance of the electrostatic chuck part may deteriorate.

Moreover, in this electrostatic chuck part, the thickness of the adhesive layer is small compared to electrostatic chuck parts of other electrostatic chuck devices, the flow velocity in a cooling gas jetting portion is fast, and the heat transfer of cooling gas is great. Therefore, there is also a problem in that the temperature near the cooling gas hole may drop.

The invention has been made in view of the above circumstances, and protects an adhesive layer provided between an electrostatic chuck part and a cooling base part from plasma or radicals (free radicals) when being applied to treatment apparatuses, such as a plasma etching apparatus. Accordingly, an object of the invention is to provide an electrostatic chuck device that can improve voltage resistance in the electrostatic chuck part and has no possibility that the temperature near a cooling gas hole may drop.

Solution to Problem (1) An electrostatic chuck device includes an electrostatic chuck part that has a placement surface for placing a plate-shaped sample and has an internal electrode for electrostatic attraction built therein; and a cooling base part that cools the electrostatic chuck part. The electrostatic chuck part and the cooling base part are integrally adhered to each other via a first adhesive layer. The electrostatic chuck part and the cooling base part are formed with a cooling gas hole passing through the electrostatic chuck part and the cooling base part and/or a pin-inserting hole allowing a pin for attaching/detaching the plate-shaped sample to be inserted thereinto. An insulator having a double pipe structure including a first insulator and a second insulator provided coaxially with an outer peripheral portion of the first insulator is provided in any one or both of the cooling gas hole and the pin-inserting hole so as to cover at least an exposed surface of the first adhesive layer.

(2) The electrostatic chuck device according to the above (1), in which an upper end portion of the first insulator is adhered to the electrostatic chuck part via a thin second adhesive layer.

(3) The electrostatic chuck device according to the above (1) or (2), in which an upper end portion of the second insulator is located below an upper end portion of the first insulator and is covered with the first adhesive layer.

(4) The electrostatic chuck device according to any one of the above (1) to (3), in which the first adhesive layer is formed by curing a thermosetting adhesive.

(5) The electrostatic chuck device according to any one of the above (1) to (4), in which the first insulator is pressed against the electrostatic chuck part via the second adhesive layer by a stress caused by a thermal expansion difference between the cooling base part and the first adhesive layer.

Advantageous Effects of Invention

According to the electrostatic chuck device of the invention, the insulator having the double pipe structure including the first insulator and the second insulator provided coaxially with the outer peripheral portion of the first insulator is provided in any one or both of the cooling gas hole and the pin-inserting hole so as to cover at least the exposed surface of the first adhesive layer. Accordingly, the insulator having the double pipe structure can protect the adhesive layer from plasma or radicals (free radicals) that enter from the outside. As a result, the voltage resistance in the electrostatic chuck part can be improved.

Additionally, since an inner surface of any one or both of the cooling gas hole and the pin-inserting hole is protected in a heat-insulated state by the insulator having the double pipe structure, even when cooling gas, such as helium, has flowed through any one or both of the cooling gas hole and the pin-inserting hole, there is no risk that the temperature near the cooling gas hole may drop. Accordingly, the temperature of the electrostatic chuck part can be stabilized.

Since the upper end portion of the first insulator is adhered to the electrostatic chuck part via the thin second adhesive layer, the thickness of the second adhesive layer interposed between the first insulator and the electrostatic chuck part can be made extremely small. As a result, plasma or radicals (free radicals) can be prevented from entering the first adhesive layer.

Additionally, since the upper end portion of the second insulator is located below the upper end portion of the first insulator and is covered with the first adhesive layer, the thickness of the adhesive layer between the second insulator and the electrostatic chuck part can be secured.

Since the first adhesive layer is formed by curing a thermosetting adhesive, it is possible to maintain the adhesive property between the electrostatic chuck part and the cooling base part for a long period of time.

Additionally, since the first insulator is pressed against the electrostatic chuck part via the second adhesive layer by the stress caused by the thermal expansion difference between the cooling base part and the first adhesive layer, the first insulator can be brought into close contact with the electrostatic chuck part, and there is no risk that the first insulator may come off of the electrostatic chuck part.

DESCRIPTION OF EMBODIMENTS

Figure 1:
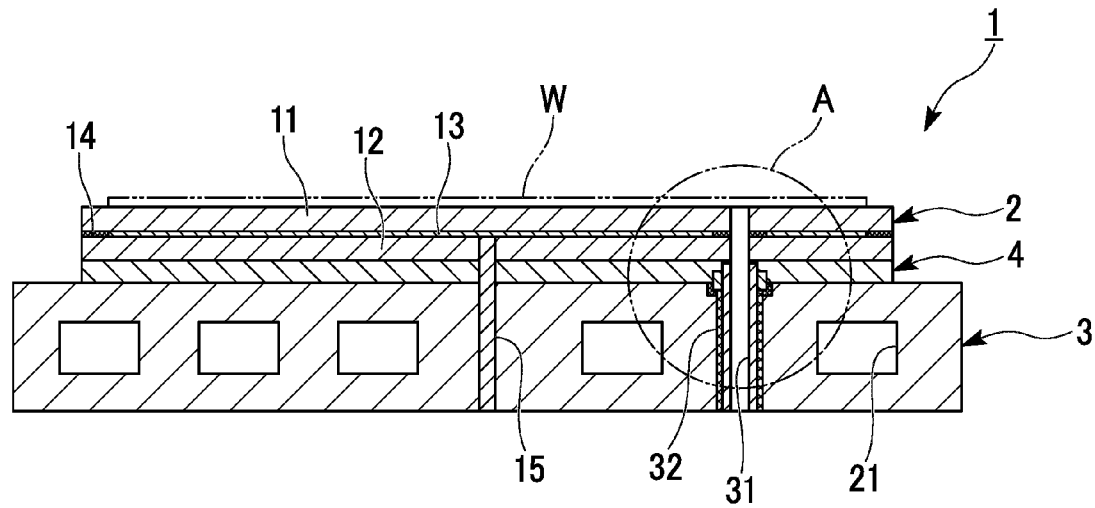
FIG. 1 is a cross-sectional view showing an electrostatic chuck device of an embodiment of the invention.

The present inventors have made earnest investigation in order to solve the above problems, and consequently, have obtained the following knowledge and have completed the invention. That is, if there is adopted the configuration of an electrostatic chuck device that includes an electrostatic chuck part, which has a placement surface for placing a plate-shaped sample and has an internal electrode for electrostatic attraction built therein; and a cooling base part that cools the electrostatic chuck part, in which the electrostatic chuck part and the cooling base part are integrally adhered to each other via a first adhesive layer, the electrostatic chuck part and the cooling base part are formed with a cooling gas hole passing through the electrostatic chuck part and the cooling base part and/or a pin-inserting hole allowing a pin for attaching/detaching the plate-shaped sample to be inserted thereinto, and an insulator having a double pipe structure including a first insulator and a second insulator provided coaxially with an outer peripheral portion of the first insulator is provided in any one or both of the cooling gas hole and the pin-inserting hole so as to cover at least an exposed surface of the first adhesive layer, the first adhesive layer can be protected from plasma or radicals (free radials) by the insulator having the double pipe structure and hence a voltage resistance in the electrostatic chuck part can be improved, and the cooling gas hole is thermally shielded by the insulator having the double pipe structure, whereby there is no risk that the temperature near the cooling gas hole may drop.

In this electrostatic chuck device, the insulator having the double pipe structure including the first insulator and the second insulator provided coaxially with the outer peripheral portion of the first insulator is provided in any one or both of the cooling gas hole and the pin-inserting hole so as to cover at least the exposed surface of the first adhesive layer, whereby the insulator having the double pipe structure protects the first adhesive layer from plasma or radicals (free radicals) that enter from the outside.

Hence, there is no risk that plasma or radicals (free radicals) may enter the first adhesive layer, and the first adhesive layer is able to continue maintaining the adhesion function as an adhesive layer. As a result, the voltage resistance in the electrostatic chuck part can be improved. Moreover, even when cooling gas, such as helium, has flowed through the cooling gas hole, an inner surface of any one or both of the cooling gas hole and the pin-inserting hole is protected in a heat-insulated state by the insulator having the double pipe structure, whereby there is no risk that the temperature near any one or both of the cooling gas hole and the pin-inserting hole may drop. This stabilizes the temperature of the electrostatic chuck part.

In this electrostatic chuck device, an upper end portion of the first insulator is adhered to the electrostatic chuck part via a thin second adhesive layer, whereby the thickness of the second adhesive layer interposed between the first insulator and the electrostatic chuck part becomes extremely small. This prevents plasma or radicals (free radicals) from entering the first adhesive layer.

In this electrostatic chuck device, a configuration in which an upper end portion of the second insulator is located below the upper end portion of the first insulator and is covered with the first adhesive layer is adopted, whereby the thickness of the adhesive layer between the second insulator and the electrostatic chuck part is secured.

In this electrostatic chuck device, since the first adhesive layer is formed by curing a thermosetting adhesive, it is possible to maintain the adhesive property between the electrostatic chuck part and the cooling base part for a long period of time.

In this electrostatic chuck device, the first insulator is pressed against the electrostatic chuck part via the second adhesive layer with the stress caused by a thermal expansion difference between the cooling base part and the first adhesive layer. Accordingly, the first insulator is brought into close contact with the electrostatic chuck part, and there is no risk that the first insulator may come off of the electrostatic chuck part.

Modes for carrying out the electrostatic chuck device of the invention will be described.

The following respective embodiments will be specifically described in order to make the concept of invention understood better, and do not limit the invention unless particularly specified. Additions, omissions, substitutions, and other modifications can be made without departing from the concept of the invention.

Figure 2:
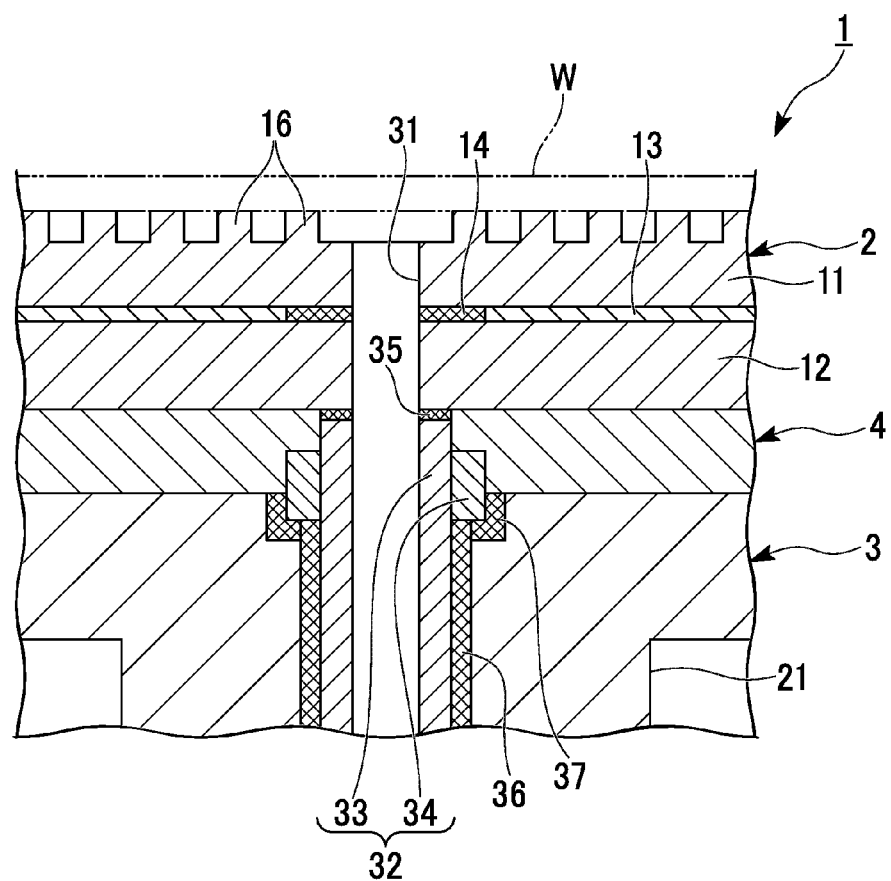
FIG. 2 is a cross-sectional view showing a cross-section of an A portion of the electrostatic chuck device of FIG. 1.

FIG. 1 is a cross-sectional view showing an electrostatic chuck device of an embodiment of the invention, and FIG. 2 is a cross-sectional view showing a cross-section of an A portion of the electrostatic chuck device. In the electrostatic chuck device 1, an electrostatic chuck part 2 and a cooling base part 3 are integrally adhered to each other by an (first) adhesive layer 4.

The electrostatic chuck part 2 is constituted by a circular placing plate 11 whose an upper surface (one principal surface) is used as a placement surface for placing a plate-shaped sample W, such as a semiconductor wafer, a circular supporting plate 12 that is arranged to face a lower surface (another principal surface) side of the placing plate 11, a circular internal electrode 13 for electrostatic attraction that is sandwiched between the placing plate 11 and the supporting plate 12 and has a diameter smaller than the placing plate 11 and the supporting plate 12, an insulating material layer 14 that is provided so as to surround a peripheral edge portion of the internal electrode 13 for electrostatic attraction, and a power-supplying terminal 15 that is connected to a lower surface of the internal electrode 13 for electrostatic attraction and applies a direct current voltage.

It is preferable that both the placing plate 11 and the supporting plate 12 be ceramics having heat resistance. It is preferable that the ceramics be ceramics consisting of one kind selected from aluminum nitride (AlN), aluminum oxide ($Al_2O_3$), silicon nitride ($Si_3N_4$), zirconium oxide ($ZrO_2$), sialon, boron nitride (BN), and silicon carbide (SiC), or composite ceramics including two or more kinds selected from these.

Particularly, since the upper surface of the placing plate 11 serves as an electrostatic attracting surface for placing the plate-shaped sample W, such as a semiconductor wafer, it is preferable to select a material that has high permittivity and does not become an impurity with respect to the plate-shaped sample W to be electrostatically attracted. For example, a silicon carbide-aluminum oxide composite sintered body, which contains 4 wt. % or more and 20 wt. % or less of silicon carbide and has aluminum oxide as the balance, is preferable.

A plurality of projections 16 whose diameter is smaller than the thickness of the plate-shaped sample W are formed on the electrostatic attracting surface of the placing plate 11, and the projections 16 are configured so as to support the plate-shaped sample W.

As the internal electrode 13 for electrostatic attraction, plate-shaped conductive ceramics whose thickness is about 10 μm to about 50 μm are used. The volume specific resistance value under the service temperature of the conductive ceramics that constitute the internal electrode 13 for electrostatic attraction is preferably $1.0 \times 10^6$ Ω·cm or less, and more preferably $1.0 \times 10^4$ Ω·cm or less.

As the conductive ceramics, a silicon carbide (SiC)-aluminum oxide ($Al_2O_3$) composite sintered body, a tantalum nitride (TaN)-aluminum oxide ($Al_2O_3$) composite sintered body, a tantalum carbide (TaC)-aluminum oxide ($Al_2O_3$) composite sintered body, a molybdenum carbide ($Mo_2C$)-aluminum oxide ($Al_2O_3$) composite sintered body, and the like may be cited.

The insulating material layer 14 integrally adheres the placing plate 11 and the supporting plate 12 to each other and protects the internal electrode 13 for electrostatic attraction from plasma.

As a material that constitutes the insulating material layer 14, an insulating material with the same main component as the placing plate 11 and the supporting plate 12 is preferable, and for example, when the placing plate 11 and the supporting plate 12 are constituted by a silicon carbide-aluminum oxide composite sintered body, aluminum oxide ($Al_2O_3$) is preferable.

The cooling base part 3 is provided below the electrostatic chuck part 2 to control the temperature of the electrostatic chuck part 2 to a desired temperature, has an electrode for generating high-frequency waves, and is constituted by metal having excellent thermal conductivity, such as aluminum (Al), an aluminum alloy, copper (Cu), a copper alloy, or stainless steel (SUS).

A flow path 21 for circulating a cooling medium, such as water or an organic solvent, is formed inside the cooling base part 3, so that the temperature of the plate-shaped sample W placed on the upper surface (electrostatic attracting surface) of the placing plate 11 can be maintained at a desired temperature.

It is preferable that alumite treatment or forming of an insulating film, such as alumina, be performed on at least the surface of the cooling base part 3 exposed to the plasma.

By performing the alumite treatment or the forming of the insulating film, on at least the surface of the cooling base part 3 exposed to the plasma, plasma resistance is improved and abnormal electrical discharge is prevented. Accordingly, plasma resistance stability is improved. Additionally, since the surface is not easily damaged, occurrence of damage can be prevented.

The adhesive layer 4 integrally adheres the electrostatic chuck part 2 and the cooling base part 3 to each other, and an adhesive having heat resistance in a temperature range (−20° C. to 150° C.) is preferable. For example, acrylic resin, silicon-based resin, epoxy-based resin, or the like is suitable. Particularly, when oxygen-based plasma is used, silicon-based resin having excellent plasma resistance against the oxygen-based plasma is preferable.

The shape of the adhesive layer 4 may be a cured film obtained by curing a sheet-like or film-like adhesive, which is cured by heating a coated film obtained by coating a liquid thermosetting adhesive, through thermocompression bonding or the like.

The electrostatic chuck part 2, the cooling base part 3, and the adhesive layer 4 are formed with a plurality of cooling gas holes 31 that supply cooling gas, such as helium (He) passing through these parts, from the cooling base part 3 side toward the plate-shaped sample W placed on the electrostatic chuck part 2, cool the plate-shaped sample W to a predetermined temperature, and hold the temperature.

An insulator 32 having a double pipe structure is fitted into each cooling gas hole 31, and an exposed surface of the adhesive layer 4 exposed to the cooling gas hole 31 is covered with the insulator 32 having the double pipe structure, whereby the exposed surface of the adhesive layer 4 is protected from plasma or radicals (free radicals).

The insulator 32 having the double pipe structure is constituted by an (first) insulator 33 that is embedded in an inner wall of the cooling gas hole 31 at a position corresponding to the cooling base part 3 and the adhesive layer 4, and an (second) insulator 34 that is coaxially fitted into an outer peripheral portion of the insulator 33 and has an external diameter greater than the insulator 33.

An upper end portion of the insulator 34 is located below an upper end portion of the insulator 33, and the respective upper ends of the insulators 33 and the insulator 34 are covered with the adhesive layer 4. Accordingly, the thickness of the adhesive layer between the insulator 34 and the electrostatic chuck part 2 can be secured to a predetermined thickness.

It is preferable that the insulators 33 and 34 be ceramics having durability against plasma or radicals (free radicals). It is preferable that the ceramics be ceramics consisting of one kind selected from aluminum nitride (AlN), aluminum oxide ($Al_2O_3$), silicon nitride ($Si_3N_4$), zirconium oxide ($ZrO_2$), sialon, boron nitride (BN), and silicon carbide (SiC), or composite ceramics including two or more kinds selected from these.

The insulator 33 is adhered and fixed to the supporting plate 12 of the electrostatic chuck part 2 via a thin (second) adhesive layer 35.

On the other hand, a lower end surface of the insulator 34, and the portion of the insulator 33 below the insulator 34 are covered with an adhesive layer 36, and a lower half portion of an outer peripheral portion of the insulator 34 is covered with an adhesive layer 37.

In this way, the insulators 33 and 34 are integrally adhered to the cooling base part 3 by the adhesive layers 35 to 37.

Flexible organic resin having durability against plasma or radicals (free radicals) is preferable as the adhesive layers 35 and 36, and curable resin obtained by curing liquid resin through heating or the like is preferable as this organic resin.

As the curable resin, for example, acrylic resin, silicon-based resin, epoxy-based resin, or the like may be cited. Particularly, when oxygen-based plasma is used, silicon-based resin having excellent plasma resistance against the oxygen-based plasma is preferable.

This silicon-based resin is resin having excellent heat resistance and excellent elasticity, and is a silicon compound having a siloxane bond (Si—O—Si). This silicon-based resin can be expressed, for example, by a chemical formula that is the following Formula (1) or Formula (2).

[Chemical Formula 1]

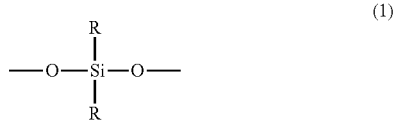

(1)

Here, R is H or an alkyl group ($C_nH_{2n+1}$-: n is an integer).

[Chemical Formula 2]

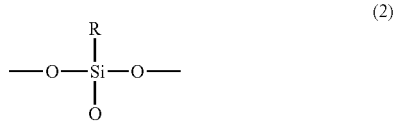

(2)

Here, R is H or an alkyl group ($C_nH_{2n+1}$-: n is an integer).

As such silicon-based resin, particularly, silicon resin whose thermal curing temperature is 70° C. to 140° C. is preferable.

Here, if the thermal curing temperature is lower than 70° C., this is not preferable because the silicon-based resin interposed between the electrostatic chuck part 2 and the insulator 33 begins to be cured in the initial process of curing, and workability is inferior. On the other hand, if the thermal curing temperature exceeds 140° C., a thermal expansion difference between the electrostatic chuck part 2 and the cooling base part 3 becomes large. As a result, this is not preferable because the silicon-based resin cannot absorb the stress between the electrostatic chuck part 2 and the cooling base part 3, the stress increases, and there is risk that peeling may occur between these parts.

The thickness of the adhesive layer 35 needs to be a thickness such that plasma or radicals (free radicals) cannot easily enter the adhesive layer 35. For example, 0.1 μm or more and 100 μm or less is preferable, and 10 μm or more and 50 μm or less is more preferable.

On the other hand, arbitrary adhesive layers that can integrally adhere the insulator 34 to the cooling base part 3 may be used as the adhesive layer 37. Similar to the adhesive layer 4, an adhesive having heat resistance in a temperature range of (−20° C. to 150° C.) is preferable. For example, acrylic resin, silicon-based resin, epoxy-based resin, or the like is suitable. Particularly, when oxygen-based plasma is used, silicon-based resin having excellent plasma resistance against the oxygen-based plasma is preferable.

The shape of the adhesive layer 37 may be arbitrary shapes that can integrally adhere the insulator 34 to the cooling base part 3, and may be a sheet-like or film-like cured film, which is cured by heating a coated film obtained by coating a liquid thermosetting adhesive.

In the electrostatic chuck device 1, the insulator 32 having the double pipe structure including the insulator 33 and the insulator 34 is provided in the cooling gas hole 31 so as to cover the exposed surface of the adhesive layer 4, whereby the insulator 32 having the double pipe structure protects the adhesive layer 4 from plasma or radicals (free radicals) that enter from the cooling gas hole 31.

Accordingly, there is no risk that the adhesive layer 4 may be eroded by the plasma or radicals (free radicals) that enter from the cooling gas hole 31, and it is possible to maintain the adhesion function of the adhesive layer 4. As a result, the voltage resistance in the electrostatic chuck part 2 is improved.

Additionally, even when cooling gas, such as helium, has flowed through the cooling gas hole 31, the inner surface of the cooling gas hole 31 is protected in a heat-insulated state by the insulator 32 having the double pipe structure. Thus, the adhesive layer 4 is not easily influenced by the temperature of the cooling gas, and there is no risk that the temperature of the adhesive layer 4 near the cooling gas hole 31 may drop. Accordingly, the temperature of the cooling base part 3 is stabilized. As a result, the temperature of the electrostatic chuck part 2 is also stabilized.

As described above, according to the electrostatic chuck device 1 of the present embodiment, the insulator 32 having the double pipe structure including the insulator 33 and the insulator 34 coaxially fitted into the outer peripheral portion of the insulator 33 is fitted into the cooling gas hole 31 passing through the electrostatic chuck part 2, the cooling base part 3, and the adhesive layer 4. The insulator 32 having the double pipe structure can protect the adhesive layer 4 from plasma or radicals (free radicals). As a result, the voltage resistance in the electrostatic chuck part 2 can be improved.

Additionally, since the inner surface of the cooling gas hole 31 is protected in a heat-insulated state by the insulator 32 having the double pipe structure, even when the cooling gas flows through the cooling gas hole 31, there is no risk that the temperature near the cooling gas hole 31 may drop, and the temperature of the electrostatic chuck part 2 can be stabilized.

Since the upper end portion of the insulator 33 is integrally adhered to the supporting plate 12 of the electrostatic chuck part 2 via the thin adhesive layer 35, plasma or radicals (free radicals) can be prevented from entering the adhesive layer 4.

Since the upper end portion of the insulator 34 is located below the upper end portion of the insulator 33 and the upper end portion of the insulator 34 is covered with the adhesive layer 4, the thickness of the adhesive layer between the insulator 34 and the electrostatic chuck parts 2 can be secured. As a result, it is possible to improve the voltage resistance between the insulator 34 and the electrostatic chuck part 2.

Since the adhesive layer 4 is formed by curing a thermosetting adhesive, it is possible to maintain the adhesive property between the electrostatic chuck part 2 and the cooling base part 3 for a long period of time.

Moreover, since the insulator 33 is pressed against the electrostatic chuck part 2 via the adhesive layer 35 by the stress caused by the thermal expansion difference between the cooling base part 3 and the adhesive layer 4, the insulator 33 can be brought into close contact with the supporting plate 12 of the electrostatic chuck part 2, and there is no risk that the insulator 33 may come off of the electrostatic chuck part 2.

In the electrostatic chuck device 1 of the present embodiment, there is adopted a configuration in which the insulator 32 having the double pipe structure is fitted into the cooling gas hole 31 passing through the electrostatic chuck part 2, the cooling base part 3, and the adhesive layer 4. However, there may be adopted a configuration in which the insulator 32 having the double pipe structure is fitted into a pin-inserting hole allowing a pin for attaching/detaching a plate-shaped sample to be inserted thereinto.

In this case, the temperature of the electrostatic chuck part 2 can be further stabilized by inserting the insulator 32 having the double pipe structure into both the cooling gas hole 31 and the pin-inserting hole.

EXAMPLES

Hereinafter, although the invention will be specifically described according to Example and Comparative Example, the invention is not limited by the following Example.

Example

Manufacture of Power-Supplying Terminal

Aluminum oxide-tantalum carbide composite powder containing 40 parts by weight of aluminum oxide powder (mean particle diameter of 0.2 μm) and 60 parts by weight of tantalum carbide powder (mean particle diameter of 1 μm) was molded and then baked under pressure to obtain a rod-shaped aluminum oxide-tantalum carbide conductive composite sintered body with a diameter of 2.5 mm and a length of 10 mm. The obtained sintered body was used as the power-supplying terminal 15.

"Manufacture of Supporting Plate"

Mixed powder containing 5 parts by weight of high-purity silicon carbide fine powder and 95 parts by weight of aluminum oxide powder (mean particle diameter of 0.2 μm) was molded and baked to obtain a supporting plate 12 with a diameter of 320 mm and a thickness of 4 mm.

Next, a fixing hole for fitting and fixing the power-supplying terminal 15 and a plurality of cooling gas holes for introducing cooling gas were drilled in the supporting plate 12.

"Manufacture of Placing Plate"

The placing plate 11 made of a disk-shaped silicon carbide-aluminum oxide composite sintered body with a diameter of 320 mm and a thickness of 4 mm was obtained according to the above manufacture of the supporting plate 12.

Next, a plurality of cooling gas holes for introducing cooling gas were drilled in the placing plate 11.

"Integration"

The power-supplying terminal 15 was fitted into and fixed to the fixing hole drilled in the supporting plate 12. Next, a coating liquid, in which mixed powder containing 40 wt. % of aluminum oxide powder and 60 wt. % of tantalum carbide powder is dispersed in terpineol, was coated by a screen printing method on a region on the supporting plate 12 where an internal electrode for electrostatic attraction is to be formed, and then, the coating liquid was dried to form an internal electrode formation layer for electrostatic attraction.

Next, a coating liquid containing aluminum oxide powder (mean particle diameter of 0.2 μm) and ethanol was coated by the screen printing method on regions other than the region on the supporting plate 12 where the internal electrode for electrostatic attraction is to be formed, and then the coating liquid was dried to form an insulating material layer formation layer.

Next, the placing plate 11 was superimposed on the internal electrode formation layer for electrostatic attraction and the insulating material layer formation layer of the supporting plate 12. Next, these were baked under pressure and integrated by a hot press to obtain the electrostatic chuck part 2. The conditions of the hot press at this time were 1750° C. in temperature and 7.5 MPa in pressure.

"Manufacture of Cooling Base Part"

Machining was performed on an aluminum (Al) block and the cooling base part 3 with a diameter of 340 mm and a thickness of 28 mm was manufactured.

Next, a through-hole for fitting and fixing the power-supplying terminal 15 and a plurality of cooling gas holes for introducing cooling gas were drilled in the cooling base part 3.

"Manufacture of Insulator Having Double Pipe Structure"

The insulator 33 with an external diameter of 5 mm, an internal diameter of 2 mm, and a length of 28 mm and the insulator 34 with an external diameter of 8 mm, an internal diameter of 4.9 mm, and a length of 8 mm were obtained using aluminum oxide.

Accordingly, the insulator 32 having the double pipe structure including the insulator 33 and the insulator 34 was obtained.

Next, the insulator 34 was integrally adhered to the cooling gas hole 31 of the cooling base part 3 via the adhesive layer 37.

Next, the adhesive layer 4 was formed by coating silicon-based resin on the adhesion surface of the cooling base part 3, which has the insulator 34 attached thereto, to be adhered to the electrostatic chuck part 2.

Next, the cooling base part 3 having the insulator 34 attached thereto and the electrostatic chuck part 2 were superimposed on each other.

Next, a thermosetting type acrylic adhesive was coated on the supporting plate side and side surfaces of the insulator 33, the insulator 33 was fitted into the insulator 34, and the thermosetting type acrylic adhesive was cured by heating treatment to obtain the adhesive layers 35 and 36, and the electrostatic chuck part 2 and the cooling base part 3 were integrally adhered to each other via the adhesive layers 35, 36, and 4.

"Evaluation"

The adhesion state of the adhesive layer 4, the voltage resistance of the electrostatic chuck part 2, and temperature changes in the outer peripheral portion of the electrostatic chuck part 2 were evaluated after a 12-inch silicon wafer was used as the plate-shaped sample, this silicon wafer was electrostatically attracted to the electrostatic chuck device 1, the temperature of a refrigerant of the cooling base part 3 was set to 20° C., the applied electric power of plasma was set to 3000 W, the application time of the plasma was set to 120 seconds, the application interval of plasma was set to 2 minutes, and the plasma was applied 5000 times in total.

The evaluation method is as follows.

(1) Adhesion State of Adhesive Layer

The adhesion state of the adhesive layer was investigated using an ultrasonic flaw detection testing device.

(2) Voltage Resistance in Side Surface Portion of Electrostatic Chuck Part

A conductive tape was stuck on the placement surface of the electrostatic chuck part, a predetermined voltage was applied between the cooling base part and the conductive tape, and the presence/absence of electric discharge was investigated.

(3) Temperature Changes in Outer Peripheral Portion of Electrostatic Chuck Part

The surface temperature of the outer peripheral portion of the electrostatic chuck device was measured using a wafer for temperature measurement in a state in which the plasma was applied to the electrostatic chuck device.

The following can be understood from the evaluation results of these.

It is confirmed that there is no change at all in the adhesion state of the adhesive layer 4, an excellent adhesion state is held, and corrosion resistance is excellent.

Additionally, the voltage resistance is 5000 V at the side surface portion of the cooling gas hole 31 of the electrostatic chuck part 2, and the temperature change in the outer peripheral portion of the electrostatic chuck part 2 is 1° C. or lower.

Comparative Example

An electrostatic chuck device was obtained according to Example except that the insulator 32 having the double pipe structure was not fitted into the cooling gas hole 31.

Next, the adhesion state of the adhesive layer 4, the voltage resistance in the electrostatic chuck part 2, and the temperature changes in the outer peripheral portion of the electrostatic chuck part 2 were evaluated according to Example after plasma application.

The following can be understood from the evaluation results of these.

It is confirmed that, as for the temperature of the electrostatic chuck part 2 in an initial state, the temperature around the cooling gas hole 31 is 2° C. lower than the other regions, and after a plasma test, an abnormality resulting from an ultrasonic wave occurs around the cooling gas hole 31 of the adhesive layer 4 compared to the initial state.

Additionally, the voltage resistance of the electrostatic chuck part 2 is 4000 V which is lower than that of Example, and the surface temperature in the peripheral edge portion of the electrostatic chuck part 2 is increased by 3° C. from the initial state.

In this way, in the electrostatic chuck device of the comparative example, the corrosion resistance, the voltage resistance, and the temperature in the outer peripheral portion are inferior to those of the electrostatic chuck device of Example.

INDUSTRIAL APPLICABILITY

In the electrostatic chuck device of the invention, the insulator 32 having the double pipe structure including the insulator 33 and the insulator 34 provided coaxially with the outer peripheral portion of the insulator 33 is provided in the cooling gas hole 31 so as to cover the exposed surface of the adhesive layer 4 on the cooling gas hole 31 side. As a result, since the adhesive layer 4 can be protected from plasma or radicals (free radicals), the voltage resistance in the electrostatic chuck part 2 can be improved, and the surface temperature of the electrostatic chuck part 2 can be stabilized, the applicability of the invention is very high.

REFERENCE SIGNS LIST

1: ELECTROSTATIC CHUCK DEVICE
2: ELECTROSTATIC CHUCK PART
3: COOLING BASE PART
4: ADHESIVE LAYER
11: PLACING PLATE
12: SUPPORTING PLATE
13: INTERNAL ELECTRODE FOR ELECTROSTATIC ATTRACTION
14: INSULATING MATERIAL LAYER
15: POWER-SUPPLYING TERMINAL
16: PROJECTION
21: FLOW PATH
31: COOLING GAS HOLE
32: INSULATOR HAVING DOUBLE PIPE STRUCTURE
33: FIRST INSULATOR
34: SECOND INSULATOR
35: THIN SECOND ADHESIVE LAYER
36: ADHESIVE LAYER
37: ADHESIVE LAYER
W: PLATE-SHAPED SAMPLE

The invention claimed is:

1. An electrostatic chuck device comprising:
an electrostatic chuck part that has a placement surface for placing a plate-shaped sample and has an internal electrode for electrostatic attraction built therein; and
a cooling base part that cools the electrostatic chuck part,
wherein the electrostatic chuck part and the cooling base part are integrally adhered to each other via a first adhesive layer,
wherein the electrostatic chuck part and the cooling base part are formed with a cooling gas hole passing through the electrostatic chuck part and the cooling base part and/or a pin-inserting hole allowing a pin for attaching/detaching the plate-shaped sample to be inserted thereinto, and
wherein an insulator having a double pipe structure including a first insulator and a second insulator provided coaxially with an outer peripheral portion of the first insulator is provided in any one or both of the cooling gas hole and the pin-inserting hole so as to cover at least an exposed surface of the first adhesive layer.

2. The electrostatic chuck device according to claim 1, wherein an upper end portion of the first insulator is adhered to the electrostatic chuck part via a thin second adhesive layer.

3. The electrostatic chuck device according to claim 1 or 2, wherein an upper end portion of the second insulator is located below an upper end portion of the first insulator and is covered with the first adhesive layer.

4. The electrostatic chuck device according to claim 1, wherein the first adhesive layer is formed by curing a thermosetting adhesive.

5. The electrostatic chuck device according to claim 1, wherein the first insulator is pressed against the electrostatic chuck part via the second adhesive layer by a stress caused by a thermal expansion difference between the cooling base part and the first adhesive layer.

* * * * *